United States Patent [19]
Valdettaro

[11] 3,972,240
[45] Aug. 3, 1976

[54] DETENT UHF TUNER WITH PRESET MEMORY

[75] Inventor: Alarico A. Valdettaro, Bloomington, Ind.

[73] Assignee: Sarkes Tarzian, Inc., Bloomington, Ind.

[22] Filed: Aug. 26, 1974

[21] Appl. No.: 500,450

[52] U.S. Cl. .............................. 74/10.41; 74/10.54; 74/10.8; 334/51
[51] Int. Cl.² ......................................... F16H 35/18
[58] Field of Search ............. 74/10.41, 10.54, 10.60, 74/10.80, 10.15, 820; 334/51

[56] References Cited
UNITED STATES PATENTS

| | | | |
|---|---|---|---|
| 3,248,953 | 5/1966 | Hulper et al. | 74/820 |
| 3,415,127 | 12/1968 | Miner et al. | 334/51 |
| 3,415,128 | 12/1968 | Smart | 74/10.8 |
| 3,697,904 | 10/1972 | Mohri et al. | 334/51 |
| 3,777,576 | 12/1973 | Miner | 74/10.41 |

Primary Examiner—Samuel Scott
Assistant Examiner—Randall Heald
Attorney, Agent, or Firm—Mason, Kolehmainen, Rathburn & Wyss

[57] ABSTRACT

A detent type tuning mechanism for a UHF tuner having a continuously variable tuning shaft includes a detented selector shaft, a gear train interconnecting the tuning shaft and the selector shaft, and a memory type fine tuning mechanism including a rotatable turret having mounted thereon a plurality of cams each engageable by a fine tuning shaft when the selector shaft is positioned in predetermined ones of the detent positions. A Geneva mechanism is employed to rotate the turret a predetermined increment to bring a different one of the cams into engagement with the fine tuning shaft when the selector shaft is rotated a predetermined number of detent positions. Each cam thereby serves as a memory fine tuning member for a predetermined group of adjacent UHF channels corresponding to a like number of detent positions of the selector shaft. An indicator dial provides a numerical display of the precise UHF channel selected at each position of the detented selector shaft.

41 Claims, 11 Drawing Figures

DETENT UHF TUNER WITH PRESET MEMORY

BACKGROUND OF THE INVENTION

This invention relates generally to tuning mechanisms, and more particularly to detented type "memory" tuning systems for UHF television tuners.

Several techniques for providing detent type UHF television tuners are known. Several such systems are described in U.S. Pat Nos. 3,774,459 issued Nov. 27, 1973 to A. A. Valdettaro; 3,757,227 issued Sept. 4, 1973 to M. L. Weigel; 3,188,871 issued June 15, 1965 to R. E. Mentzer; 3,697,904 issued Oct. 10, 1972 to E. Mohri et al.; and 3,205,720 issued Sept. 14, 1965 to T. D. Smith. An example of a commercial memory type VHF tuner is the RCA KRK 72 RVS 8242 3. A memory type UHF tuner has also been built by German Phillips Ltd. The Phillips tuner is described in an article by J. Korn entitled "Neuartige Abstimmhilfen fur UHF" appearing in "FUNKSCHAU," Vol. 12, p. 326, 1962.

Whereas these systems provide detent type UHF tuners, the Valdettaro patent does not provide a memory type fine tuning system. A memory type fine tuning system is a system wherein each channel (or group of adjacent channels) has an independent fine tuning mechanism for providing independent fine tuning of each channel, the setting of which is maintained despite changes in channel selection. Other prior art systems provide memory type fine tuning, however, because the fine tuning mechanism is tunable over three channels and also serves as a channel selector, the resettability of each channel is marginal, and generally some degree of fine tuning adjustment is required after each channel change. Furthermore, the channel number displayed is not independent of the position of the fine tuning control, and a unique indication of the channel number is not provided.

Modern VHF tuners, such as the RCA unit referenced above, utilize a turret or a switch type tuner that has inherent detent positions. As a result, the problems encountered in converting the continuously variable motion of a UHF tuner to detented operation do not arise.

The Phillips UHF tuner is designed for the European UHF band and employs a separate fine tuning element for each UHF channel. Such a system is usable in Europe because the European UHF band contains only 40 channels. In the United States, where 70 UHF channels are provided, the use of a separate tuning element for each channel would result in a structure so large and complex as to be impractical.

Accordingly, it is an object of the present invention to provide a UHF tuning system wherein each detent position of the selector shaft corresponds to a different UHF channel, and wherein a memory type fine tuning mechanism is provided to allow independent fine tuning of groups of channels lying in adjacent detent tuning positions.

It is another object of the present invention to provide a detented UHF memory type tuning mechanism having a digital readout that uniquely displays the channel number corresponding to each channel independently of the setting of the fine tuning mechanism.

A further object of the present invention is to provide a detent type UHF tuning mechanism having a memory type fine tuning mechanism tunable over the frequency range of one television channel.

In accordance with a preferred embodiment of the invention, a UHF tuner having a continuously variable tuning shaft is coupled to a detented selector shaft by means of a reduction gear mechanism. The gear reduction ratio is chosen such that the selector shaft may be rotated several revolutions over the tuning range of the UHF tuner, and such that each detent position corresponds to one of the UHF channels in the tuning range. A rotatable turret having a plurality of cams mounted thereon is provided, and a fine tuning mechanism is provided for selectively engaging and rotating one of the cams. The particular one of the cams to be engaged is determined by the position of the rotatable turret. A cam follower is provided for coupling the cam that is positioned for engagement by the fine tuning mechanism to the UHF tuner to permit the UHF tuner to be tuned by each cam. The range over which the UHF tuner can be adjusted by any particular one of the cams is limited to less than the bandwidth of a television channel to prevent the tuner from being tuned to an adjacent channel by the fine tuning shaft. The memory function is provided by rotating the turret to bring a different cam into engagement with the cam follower for each UHF television station in the reception area and adjusting each cam to individually fine tune each UHF television station. The rotation of the turret is accomplished by means of a Geneva mechanism coupling the selector shaft and the turret. The Geneva mechanism serves to rotate the turret a predetermined increment to bring a different cam into engagement with the cam follower each time the selector shaft is advanced a predetermined number of detent positions. In order to prevent an unintentional readjustment of the cam during the rotation of the turret, a mechanism is provided to disengage the cam follower from the cam during rotation of the turret.

DESCRIPTION OF THE DRAWINGS

In the drawings:

FIG. 4 is a front sectional view of the tuning mechanism according to the invention taken along line 4—4 of FIG. 1 showing a fine tuning cam turret, the mechanism for advancing the turret and a laterally moveable idler gear coupling a selector shaft to a tuning shaft;

FIG. 5 is a cross-sectional view of the tuning mechanism taken along line 5—5 of FIG. 1 showing a pivotably mounted cam follower;

FIG. 6 is a partial cross-sectional view of the tuning turret showing a tuning cam and cam follower;

FIG. 10 is a front sectional view of the tuning mechanism taken along line 10—10 of FIG. 8 showing a fine tuning cam turret.

DETAILED DESCRIPTION OF THE INVENTION

Figure 1:
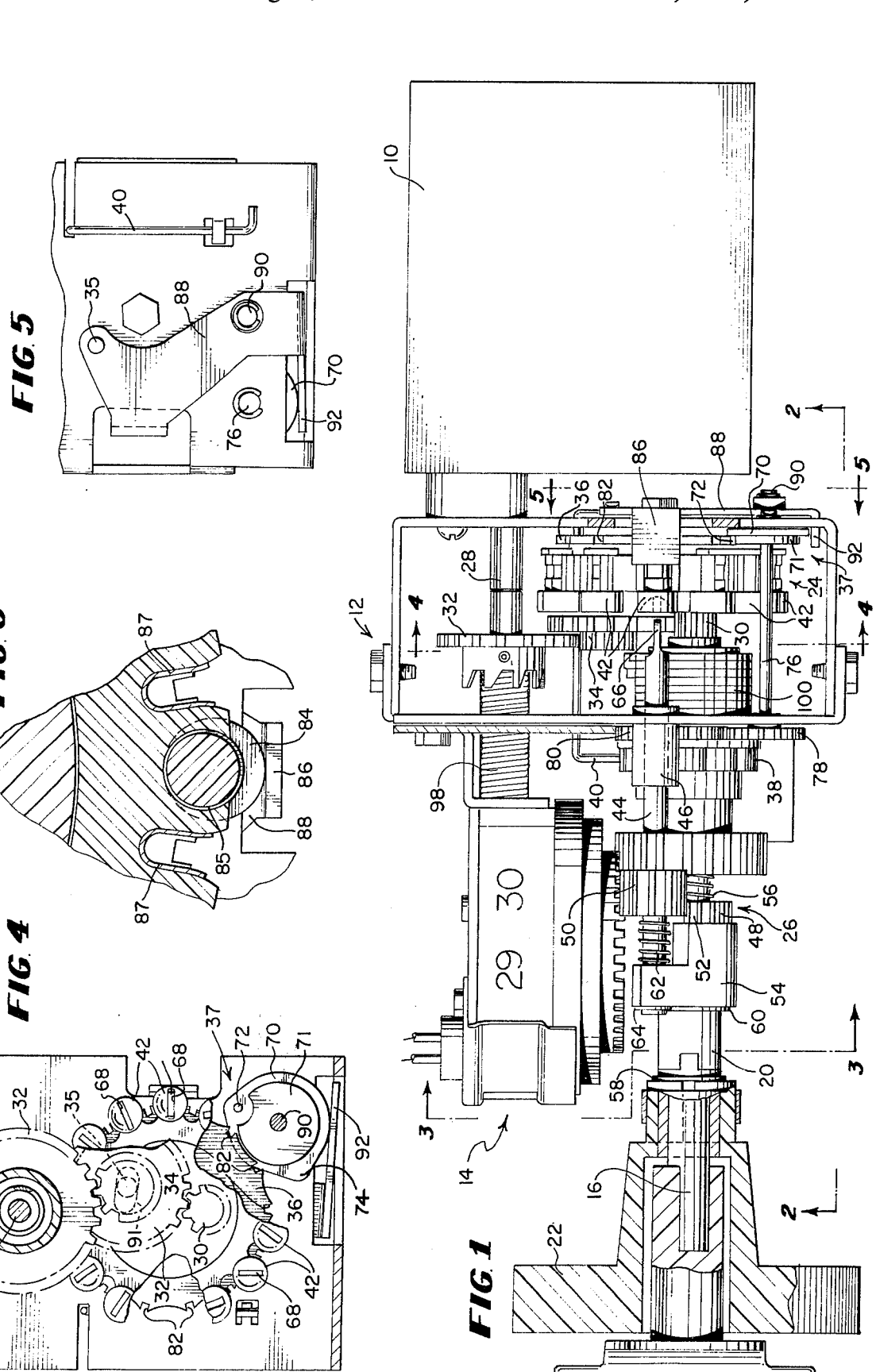
FIG. 1 is a sectional side view of a UHF television tuner employing a preferred embodiment of the detented memory type tuning mechanism according to the invention and having a channel indicator dial mounted thereon.
Figure 2:
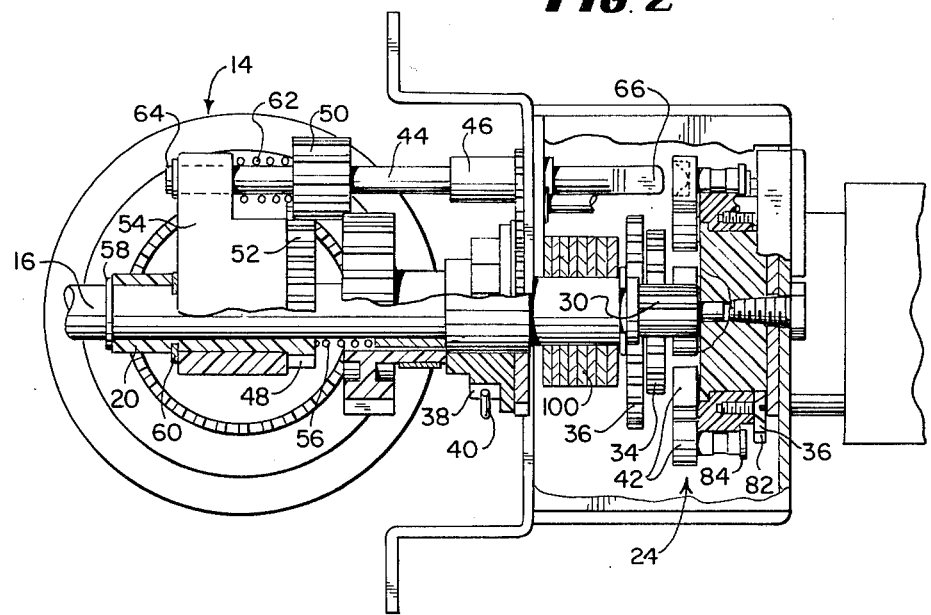
FIG. 2 is a bottom view of the tuner and tuning mechanism shown in FIG. 1.

Referring to the drawings, with particular reference to FIG. 1, there is shown a continuously variable UHF tuner 10 and the detented memory type tuning mechanism according to the invention generally designated as 12. A channel indicator dial generally designated by the numeral 14 is mounted on the tuning mechanism 12 and provides a digital readout of the number of the channel selected. The tuning indicator dial is more fully described in copending U.S. patent application Ser. No. 257,846, filed May 30, 1972, and assigned to the same assignee as the assignee of the present application. The detented tuning mechanism 12 according to the invention comprises a selector shaft 16 engageable by a tuning knob 18, a two-piece hollow fine tuning shaft 20 engageable by a fine tuning knob 22, a cam turret 24 and a cam adjusting mechanism 26. The selector shaft 16 is coupled to a continuously variable tuning shaft 28 of the tuner 10 by means of a speed reducing gear drive mechanism comprising a driving gear 30 attached to the selector shaft 16, a driven gear 32 attached to the tuning shaft 28, and a stepped idler gear 34 coupling the driving gear 30 and the driven gear 32. The stepped idler gear 34 is rotatably mounted to a shaft 35 (FIGS. 4 and 5). A turret advancing gear 36 having relatively widely spaced teeth is attached to the turret 24 and engages a Geneva mechanism 37 that is rotated by the selector shaft 16. Hence, rotation of the selector shaft 16 causes both the tuning shaft 28 and the turret 24 to rotate; the turret advancing gear 36 of the turret 24 being driven by Geneva mechanism 37, and the driven gear 32 attached to the tuning shaft 28 being driven by the driving gear 30 via the idler gear 34.

Figure 3:
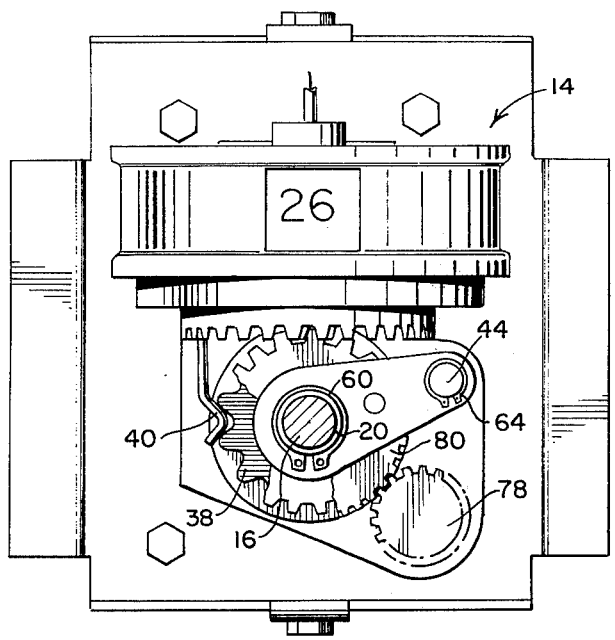
FIG. 3 is a front sectional view of the tuning mechanism according to the invention taken along line 3—3 of FIG. 1 showing a detenting mechanism and a gear for driving a turret advancing mechanism.

The selector shaft 16 has attached thereto a detenting mechanism comprising an index wheel 38 and a resiliently biased spring member 40, best shown in FIGS. 1 and 3. The detenting mechanism provides discrete tuning positions for the selector shaft 16, each detented tuning position corresponding to one of the UHF television channels. Hence, both the tuning shaft 28 and the turret 24 are adjusted in discrete steps by the tuning shaft 16.

Presently, 70 television channels have been allocated to the UHF television band. In present UHF television tuners such as the tuner 10, tuning over the entire 70 channel band is effected by rotating the tuning shaft 28 by one-half revolution or approximately 180°. Hence, it is extremely difficult for an operator of the television set to select one of the 70 channels by tuning the selector shaft 28 directly, and speed reducing gear means are generally provided to increase the ease with which the television set may be tuned. To further facilitate the tuning of the set, it is desirable to provide a tuning indicator dial to indicate the channel to which the set is tuned. The most accurate of such indicator dials is a dial wherein the number of each channel selected is individually displayed.

In order to provide an optimum drive for a digital type indicator dial, it is desirable to select the gear ratio of the speed reducing means such that tuning over the entire 70 channel band of frequencies is effectuated by seven revolutions of the selector shaft, each revolution covering 10 of the 70 channels. By providing a 14-to-1 reduction ratio between the selector shaft 16 and the tuning shaft 28, and by providing 10 detent positions in the indexing wheel 38, an indexing mechanism compatible with the digital type indicator dials having a tens indicator and a units indicator, such as the one described in the copending Valdettaro application Ser. No. 350,742, filed Apr. 13, 1973, is provided. If an indicator mechanism employing a single indicator, such as the one shown in the drawings is used, any number of detent positions may be provided in the indexing wheel 38.

When a multi-turn detented type selector system such as the one described above is employed, each detented position uniquely defines one of the UHF television channels to be received. However, most continuously tuned UHF television tuners such as the tuner 10 do not have a linear tuner shaft position versus receiving frequency characteristics. Furthermore, the operating frequency of the tuner may change with age, temperature and other factors. Hence, detented type tuning systems are generally provided with a mechanism for finely tuning the tuner to compensate for the effects of nonlinearity, temperature and aging.

In order to avoid the need for readjusting the fine tuning each time the channel is changed, it is desirable to provide a memory type fine tuning system wherein the fine tuning of each channel may be individually adjusted. Such systems are common in VHF television tuners, however, due to the large number of UHF channels allocated, it is impractical to provide a separate fine tuning mechanism for each of the seventy allocated channels. Fortunately, the Federal Communications Commission does not assign adjacent or nearby UHF channels in any given geographic area, but only assigns every sixth channel to avoid interference. Hence, since only one out of every six channels will ever be used in any geographic area, the channels may be separated into groups, and a separate fine tuning mechanism provided for each group of channels.

In the embodiment of FIG. 1 the channels are separated into groups of five. Accordingly, the turret 24 is provided with 14 individual adjusting cams 42, each of the cams 42 providing a fine tuning adjustment for a group of five adjacent channels. The ratio of the Geneva mechanism 37 is selected such that the turret 24 makes one complete revolution for every seven turns of the selector shaft 16, the turret 24 being stepped an increment equal to the distance between the cams 42 each time the selector shaft is advanced five detent positions, thereby sequentially bringing each of the cams 42 into position for engagement by the fine tuning mechanism 26.

Referring again to FIG. 1, the fine tuning mechanism 26 includes the fine tuning shaft 20, previously mentioned, a cam driving member 44 and a support sleeve 46 for the cam driving member 44. The fine tuning shaft 20 has a driving gear 48 coupled thereto, and the cam driving member 44 is coupled to a driven gear 50. An idler gear 52 couples the driving gear 48 to the driven gear 50. A gear housing 54 is mounted over the fine tuning shaft 20 and provides support to the idler gear 52 and the driven gear 50.

The fine tuning shaft 20 is slideably mounted over the selector shaft 16. A resilient biasing spring 56 is employed to urge the slideable fine tuning shaft 20 against a stop ring 58 mounted in a groove in the selector shaft 16. A second stop ring 60 is attached to the fine tuning shaft 20 to prevent axial movement between the housing 54 and the fine tuning shaft 20.

The driven gear 50, in this embodiment, is mounted to the cam driving member 44 with a press fit. The member 44 is slideably and rotatably supported by the support tube 46 and the housing 54. The press fit causes the cam driving member 44 to rotate in response to rotation of the gear 52, and slideable mounting to the housing 54 allows the member 44 to move axially over a predetermined distance with respect to the housing 54. A resilient biasing spring 62 secured by a retaining ring 64 is employed to urge the gear 50 away from a surface of the housing 54 to maintain the cam driving member in a fully extended position.

When the fine tuning mechanism 26 is positioned, as shown in FIG. 1, the cam driving member 44 is not in engagement with any of the cams 42. Fine tuning is achieved by depressing the fine tuning knob 22 along the axis of the selector shaft 16 against the biasing force of the resilient biasing spring 56. Depressing the knob 22 causes the fine tuning shaft 20 and the gear housing 54 to move axially along the selector shaft 16, thereby causing the cam driving member 44 to slide inside the support tube 46 to bring the cam driving member 44 into engagement with one of the cams 42. Fine tuning is then effected by rotating the fine tuning knob 22 which causes the fine tuning shaft 20 to rotate. The rotation of the tuning shaft 20 is coupled to the cam driving member 44 by means of the gears 48, 50 and 52. The cam driving member 44 is maintained in engagement with the cam 42 by means of the resilient spring 62, and rotation is imparted to the cam 42 by means of a blade 66 which engages a slot 68 in the cam 42.

As the turret 24 is incrementally stepped in response to the rotation of the selector shaft 16, different ones of the cams 42 are sequentially brought into position for engagement by the cam adjusting member 44. The incremental stepping is accomplished by the Geneva mechanism 37, as is described in a subsequent portion of the specification. The gear ratios of the gears driving the Geneva mechanism 37 and the number of teeth in the turret advancing gear 36 are selected such that each of the cams 42 remains in position for engagement by the cam driving member 44 for five consecutive detented positions of the selector shaft 16.

Referring to FIG. 1 in conjunction with FIGS. 3 and 4, it can be seen that the Geneva mechanism 37 has a rotatable advancing member 70 having a plate 71 and an advancing pin 72 for engaging the turret advancing gear 36 affixed thereto. The advancing member 70 has an eccentric cam lobe 74, the function of which will be explained in a subsequent portion of the specification.

The turret advancing member 70 is affixed to a shaft 76 which is rotatably mounted within the mechanism 12. A driven gear 78 is affixed to the shaft 76 and a Geneva mechanism gear 80 is affixed to the selector shaft 16. The ratios of the gears 78 and 80 are selected in this embodiment to cause the advancing member 70 to rotate one revolution each time the selector shaft 16 is advanced by five detent positions of the indexing wheel 38.

The cam turret advancing gear 36 has 14 slots 82 defined around the periphery thereof. The number of slots 82 is equal to the number of cams 42, and the slots 82 are positioned for engagement by the pin 72. As a result, each time the cam turret advancing member 70 is rotated by one revolution, one of the slots 82 is engaged by the pin 72 to advance the turret 24 by a fixed angular increment equal to the angular distance between cams 42. This results in a different one of the cams 42 being brought into position for engagement by the cam driving member 44 each time the selector shaft is rotated five consecutive detent positions. The plate 71 engages the curved teeth of the advancing gear 36 to prevent the rotation of the turret 24 when none of the slots 82 is engaged by the pin 72.

Figure 7:
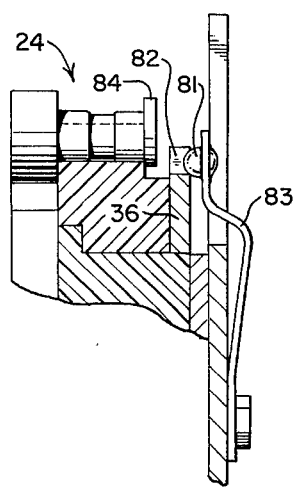
FIG. 7 is a partial view of the turret advancing gear showing an optional detenting mechanism for the turret.

In an alternative embodiment, the turret may be maintained in a fixed position between advancements by a turret detenting mechanism (FIG. 7). If the turret were not maintained in a fixed position, either by the Geneva mechanism or the detent, rotation of the turret resulting from vibration or the like could result in detuning of the tuner and result in resettability problems. The turret detenting mechanism comprises a detenting ball 81 that is biased in engagement with the turret advancing gear 36 by a resilient biasing member 83. The turret detenting mechanism maintains the turret 24 in a fixed position when it is not being advanced by the Geneva mechanism. This allows a less precise Geneva mechanism to be used without affecting the resettability of the tuner. The detenting action of the turret detenting mechanism should be weaker than the detention action of the selector shaft detent to assure that the "feel" of the selector shaft is the same between all detent positions, and that the detenting action of the turret detent is not transmitted to the selector shaft as an increase in torque resistance every fifth detent position of the selector shaft.

Fine tuning for one channel out of each group of five adjacent channels is effected by depressing the fine tuning knob 22 to cause the cam 42 to be engaged by the member 44. Rotating the cam 42 adjusts the fine tuning of the tuner 10 in the following manner. Each of the cams 42 is provided with an eccentric cam lobe 84 (FIG. 6). The cam lobe 84 of the one of the cams 42 positioned for engagement by the member 44 is engaged by a cam follower 86. The cam follower 86 forms part of a carrier 88 which is pivotably mounted about a shaft 90 (FIG. 5), and which has the idler gear 34 rotatably mounted thereon by means of the shaft 35. The turret 24 has a rotatable outer ring containing the cams 42 and a stationary center portion. The shaft 35 passes through an elongated opening 91 in the stationary portion of the turret 24. Rotation of the one of the cams 42 engaging the cam follower 86 causes the carrier 88 to be pivoted about the shaft 90. The latter pivoting motion results in a lateral translation of the gear 34 with respect to the driving gear 30. Since the driving gear 30 is fixedly held in place by the indexing wheel 38 on the shaft 16, the lateral translation of the gear 34 results in a rotation of the gear 34 about the driving gear 30. The last mentioned rotation is imparted to the driven gear 32, thereby causing a slight rotation of the tuning shaft 28 in response to a rotation of the one of the cams 42.

In an alternative embodiment, the gears may be affixed to fixed shafts and the tuner 10 pivotably mounted. A cam follower may be attached to the housing of the tuner 10 and maintained in engagement with the cams 42. Fine tuning is then effected by causing the tuner 10 to pivot about its tuning shaft in response to the rotation of one of the cams 42. Such pivoting systems are described in U.S. Pat. Nos. 3,474,362 and 3,492,608.

In order to achieve maximum resettability and to prevent the tuner from being tuned to an adjacent channel by the fine tuning shaft, the lobe of each cam 42 is shaped so that the amount of rotation that can be imparted to the tuning shaft 28 in response to the rotation of any of one of the cams 42 is limited to the minimum degree of rotation necessary to achieve fine tuning. Generally this is less than the bandwidth of one channel, and may be limited to the range of from $\pm 1$ MHz to $\pm 3$ MHz. Because of the limited range of fine tuning adjustment available, the UHF tuner 10 must be resettable with great accuracy, and must not drift appreciably as a result of aging or temperature variations. One such UHF tuner is described in U.S. Pat. No. 3,789,331. When such a tuner is employed, the fine tuning mechanism is used primarily for adjusting the tuner to compensate for local conditions such as interference, signal strength and discontinuities in the response of the receiving antenna.

Each one of the cams 42 provides a memory type fine tuning for one of the channels in each group of five adjacent channels. Fine tuning is accomplished as follows. Firstly, an active station in the broadcasting area is selected, and fine tuning is effected by depressing the fine tuning knob 22 to thereby adjust one of the cams 42 to provide an optimum picture. Since no adjacent or alternate channels are assigned in any single geographic area, no other channel need be fine tuned by means of the cam just adjusted. Tuning to another channel in the area will result in another one of the cams 42 being brought into engagement with the cam adjusting member 44. The cam 42 corresponding to the second channel to be fine tuned is adjusted in a similar manner as the cam corresponding to the first channel. Each of the channels in the area is fine tuned in a similar manner, each channel being tuned by a different one of the cams 42, thereby providing independent fine tuning of each of the television stations broadcasting in a given geographic area. The last mentioned feature makes it possible to switch between channels without readjusting the fine tuning after each channel change.

In order to assure that the setting of each of the cams 42 is maintained whenever a channel change is made, each of the cams 42 is resiliently gripped at its bearing surface 85 (FIG. 6) in a press fit by the body of the cam turret 24. This effectively prevents the rotation of the cams 42 as the channel selector shaft 16 is being tuned. Because the friction forces developed in a press fit can result in an undesirable chattering during the adjustment of the cams 42, a high viscosity liquid lubricant having a viscosity in the range of approximately 1.8 to 3.3 kilopoise is applied to the bearing area 85 of the cam 42 at the point of engagement with the turret 24. The high viscosity liquid assures smooth operation of the cams 42 and prevents the undesirable chattering of the cams 42 during adjustment, thereby resulting in much improved resettability of each channel. The lubricant used must have a high viscosity to prevent the cams 42 from being too easily adjustable to minimize accidental readjustment of the cams.

The turret 24 and the cams 42 should be fabricated from materials providing compatible bearing surfaces to assure smooth operation. Both the turret 24 and the cams 42 have been fabricated from an acetal plastic, manufactured under the trademark DELRIN, which has provided satisfactory bearing surfaces. The DELRIN also retains its resiliency when machined, and assures that the cams 42 continue to be resiliently engaged by the turret 24. Unfortunately, DELRIN tends to lose its resiliency when molded, and is quite flammable.

Other plastics, such as that manufactured under the trademark ABS, are not as flammable and also provide good bearing surfaces. Some of these plastics tend to lose their resiliency with age. Therefore, if molded DELRIN or less resilient plastics are used it may be necessary to provide resilient metal spacers such as the spacers 87 (FIG. 6) in the slots in the turret 24 to retain the cams 42.

The relative motion between the cam lobe 84 and the cam follower 86 can cause undesired rotation of the cam 42 as the turret 24 is rotated. In order to prevent the undesirable interaction between the cam lobe 84 and the cam follower 86, a mechanism is provided for disengaging the cam follower 86 from the cam lobe 84 during the time the turret 24 is being incremented. In a preferred embodiment, the disengaging mechanism includes a second cam follower 92 coupling the carrier 84 and the advancing member 70. The cam follower 92 is integrally formed with the carrier 88 and causes the carrier 88 to pivot about the shaft 90 when the cam follower 92 is engaged by the cam lobe 74 of the advancing member. The carrier 88 is resiliently biased toward the advancing member 70 by a torsion spring 98 which applies a pre-loading force to the gears 30, 32 and 34. The cam follower 92 serves to disengage the cam follower 86 from the cam 42 once for each rotation of the advancing member 70. Operation is as follows. As the selector shaft 16 is rotated during channel selection, the gears 78 and 80 cause the advancing member 70 to be rotated once for each five detent positions of the selector shaft 16. The cam lobe 74 is positioned such that the cam follower 92 is engaged by the cam lobe 74 as one of the slots 82 of the advancing gear is engaged by the pin 72. The engagement of the cam follower 92 by the lobe 74 causes the carrier 88 to rotate about the shaft 90 a sufficient amount to disengage the cam follower 86 from the cams 42 whenever the turret 24 is moved from one position to another. As a result, no tangential force is applied to the cam lobe 84 as the turret 24 is rotated to bring a different cam into position for engagement by the cam driving member 44. This reduces the probability of accidentally disturbing the cam 42 during the channel changing operation, and substantially enhances the resettability of the tuner. The only force applied to the cam by the cam follower is directed in a direction perpendicular to the axis of rotation of the cam, and does not affect the setting of the cam.

Resettability error can also occur as a result of backlash in the gear train coupling the selector shaft 16 and the tuner shaft 28. To reduce backlash, the torsion spring 98 engaging the tuner housing and the driven gear 32 is provided. The torsion spring 98 applies a constant preloading force to the driven gear 32, the idler gear 34 and the driving gear 30 to enhance the resettability of the tuner by maintaining the teeth of the gears in engagement at all times. A conventional stop mechanism 100 employing a series of stacked stop washers is provided to prevent more than seven rotations of the selector shaft 16, thereby preventing damage to the tuner 10 that could result if the tuning shaft 28 were rotated more than 180°. Alternatively, a stop mechanism similar to the one described in the Valdettaro U.S. Pat. No. 3,774,459 may be used.

Figure 8:
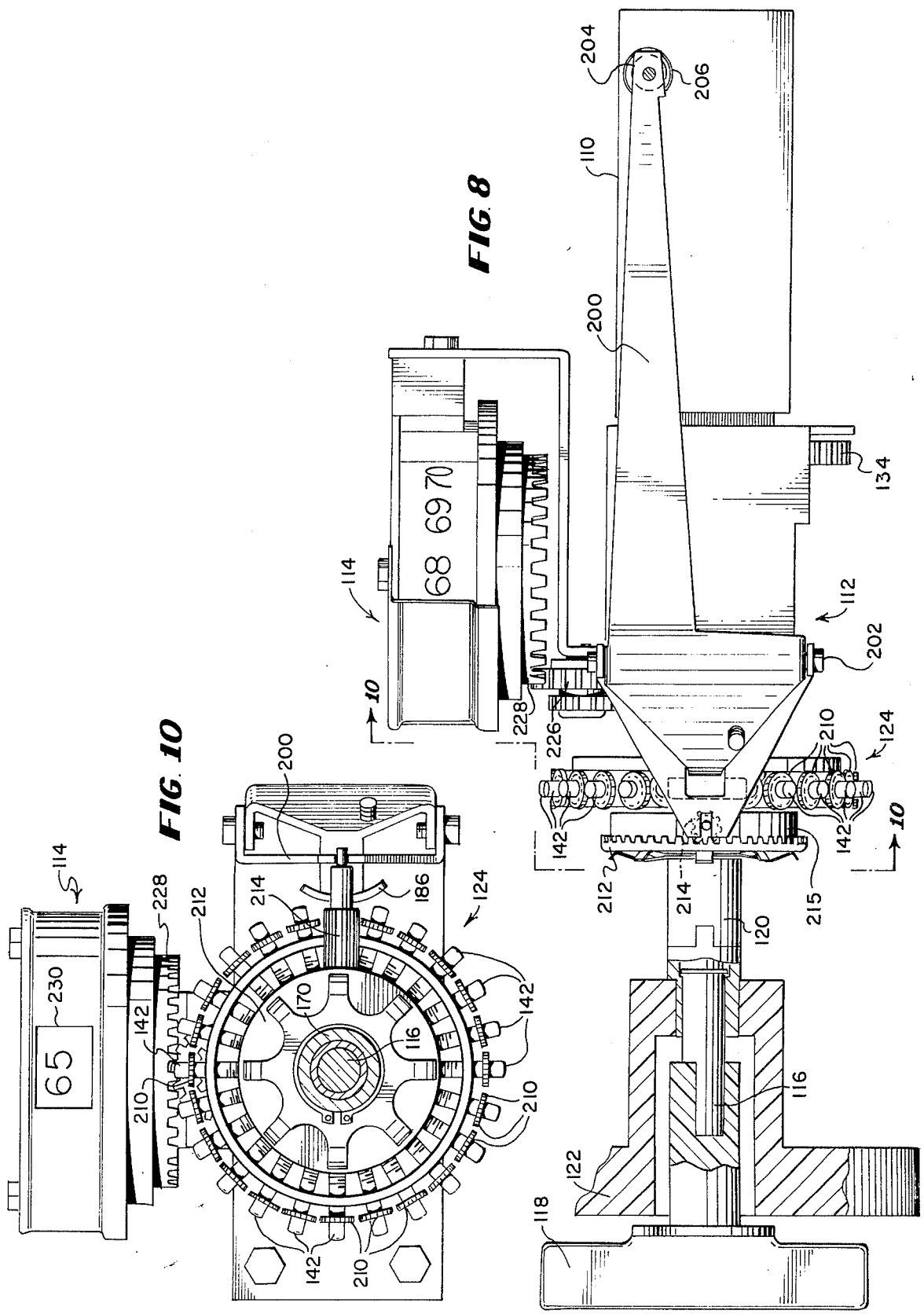
FIG. 8 is a side view of a UHF television tuner employing an alternative embodiment of the detented type memory mechanism according to the invention.

The alternative embodiment of the detented memory type tuning mechanism according to the invention shown in FIG. 8 is similar to the embodiment shown in FIG. 1, but divides the channels into groups of three because the use of smaller cams allows more cams to be used. In addition, fine tuning of the UHF tuner is accomplished electrically rather than by a mechanical rotation of the tuner shaft. Analagous components in FIG. 8 will be designated by numbers from the hundreds series having tens and units digits similar to the corresponding tens series numbers of FIG. 1. Non-analagous components will be designated by numbers from the two hundreds series.

FIG. 8 shows a continuously variable UHF tuner 110 similar to the tuner 10 shown in FIG. 1, a detented memory type tuning mechanism 112 and a channel indicator dial 114. A rotatable fine tuning turret 124 having a plurality of fine tuning cams 142 is driven by a selector shaft 116 by means of a Geneva mechanism 137. The UHF tuner 110 has a tuning shaft (not shown) that is driven by a driving gear 130 attached to the selector shaft 116, a driven gear 132 (FIG. 9) attached to the tuning shaft and an idler gear 134 (FIG. 8).

Figure 9:
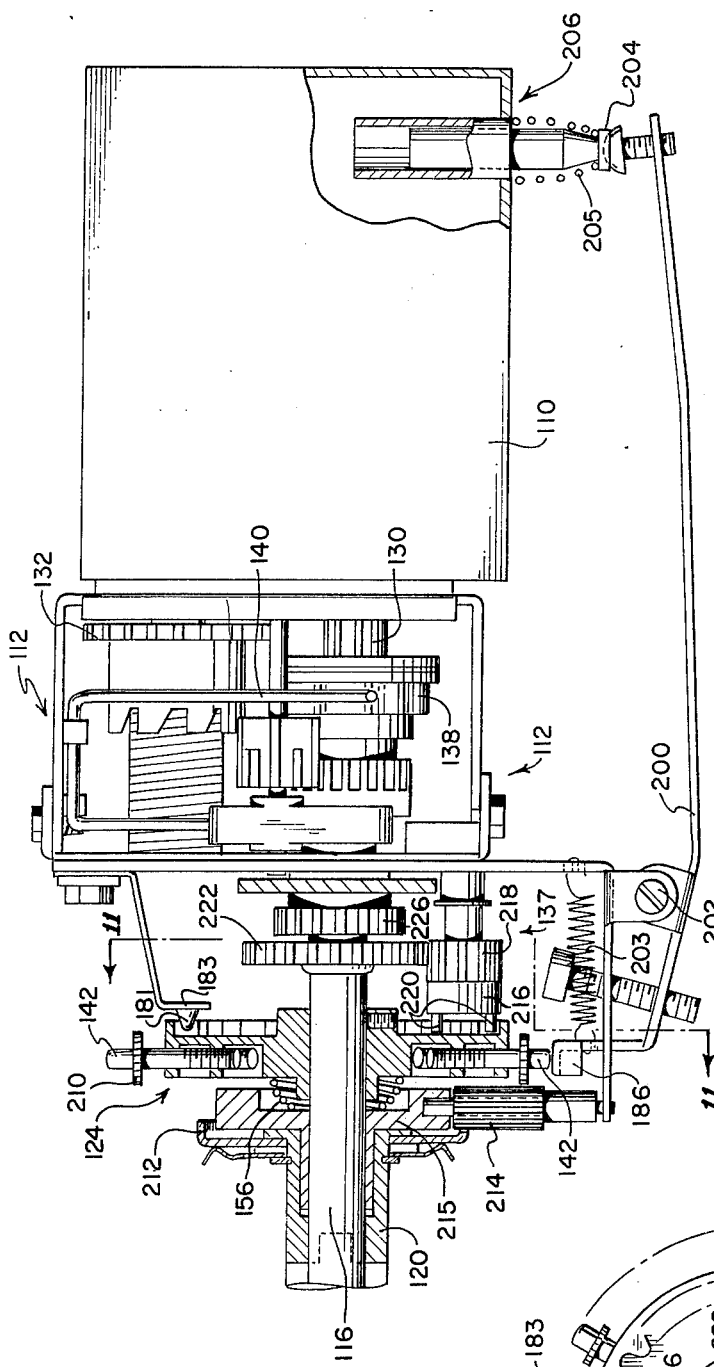
FIG. 9 is a top view, partially in cross-section of the tuner and tuning mechanism shown in FIG. 8 with the tuning indicator removed.
Figure 11:
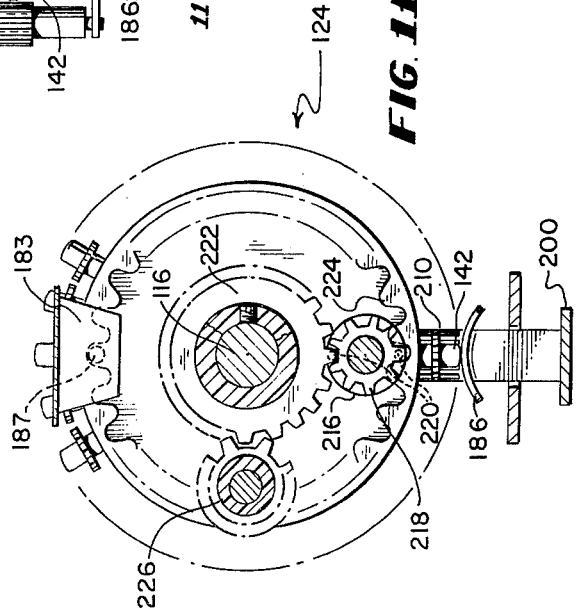
FIG. 11 is a cross-sectional view of the tuning mechanism according to the invention taken along line 11—11 of FIG. 9 showing a mechanism for advancing the cam turret.

One of the fine tuning cams 142 engages a fine tuning cam follower 186 (FIGS. 8 and 9). The cam follower 186 is part of a lever 200 pivoted about a screw 202 and held in engagement with one of the cams 142 by means of a spring 203. The lever 202 operates the piston 204 of a piston trimmer capacitor 206 which is electrically connected to the local oscillator circuit of the UHF tuner 110 to provide a fine tuning function by varying the frequency of the local oscillator.

The operation of the apparatus described above is similar to the operation of the embodiment shown in FIG. 1. As in the embodiment of FIG. 1, the selector shaft 116 is a detented selector shaft having detented positions defined by an index wheel 138 attached thereto and a spring member 140. Fine tuning is effected by rotating one of the fine tuning cams 142, thereby pivoting the lever 200 about the screw 202 to cause the piston 204 to move longitudinally within the capacitor 206. This changes the capacitance of the capacitor 206 and changes the operating frequency of the tuner 110. A spring 205 maintains the piston 204 in engagement with the lever 200.

The memory mechanism employed in this embodiment is similar to the memory mechanism described in U.S. Pat. No. 3,757,227 incorporated herein by reference. Briefly, the memory mechanism comprises a turret 124 having a plurality of cams 142 screwed therein. Each of the cams 142 has a threaded shaft so that rotation of the cams 142 causes the cams to move radially with respect to the turret 124. Each of the cams 142 has a spur gear 210 affixed thereto to enable the cam to be engaged for adjustment.

A crown gear 212 is affixed to the fine tuning shaft 120. A pinion gear 214 is rotatably mounted in a carrier 215 and positioned in engagement with the crown gear 212. The crown gear 212 and the fine tuning shaft 120 are mounted for axial movement with respect to the selector shaft 116 to permit the pinion gear 214 to be brought into engagement with one of the star gears 210. Rotation of the fine tuning shaft 120 is imparted to the crown gear 212 which in turn causes the pinion gear 214 to rotate. Fine tuning is effected upon depression and rotation of the fine tuning knob 122 against the force of a spring 156. This brings the pinion gear 214 into engagement with one of the star gears 210 and causes one of the cams 142 to rotate. Since each one of the cams 142 has a threaded shaft, the cam thus engaged is moved in a radial direction within the turret 124, and pivots the lever 200 about the screw 202 to adjust the piston 204 of the capacitor 206.

The turret 124 is advanced periodically by the Geneva mechanism 137. In the embodiment shown, the turret 124 is advanced one increment each time the selector shaft 116 is rotated an amount equal to three detent positions of the indexing wheel 138. The Geneva mechanism 137 comprises a Geneva drive member 216 having a gear 218 and a pair of advancing pins 220 integrally formed therewith. The Geneva drive member 216 is driven by a driving gear 222 attached to the selector shaft 116. The pins 220 sequentially engage a plurality of inwardly facing teeth 224 within the turret 124. The gear ratios are chosen such that the Geneva drive member 216 is rotated one-half of a revolution each time the selector shaft 116 is advanced three detent positions of the indexing wheel 138. This advances the turret 124 one increment.

The gear 222 also drives a channel indicator dial 114 by means of a stepped idler gear 226 which engages an indicator drive gear 228. The indicator drive gear 228 advances a film strip within the indicator dial 114 to advance a different channel indicating number into a window 230 formed within the indicator dial 114 each time the selector shaft is advanced one detent position. Such an indicator dial is described in copending U.S. application Ser. No. 257,846, filed May 30, 1972 by A. A. Valdettaro and assigned to the same assignee as the assignee of the present invention. The embodiment of the invention shown in FIGS. 1–7 may also use a similar indicator dial.

A resilient spring member 183 having a protrusion 181 formed therein engages the teeth 224 of the turret 124 and serves as a detenting mechanism to maintain the turret 124 in a fixed position between advancements by the Geneva mechanism. The detenting mechanism serves to improve the resettability of the tuner as described in a previous portion of the specification in conjunction with the embodiment of the invention shown in FIGS. 1–7.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A tuning system including in combination:
   a tuner having a continuously variable tuning shaft, rotation of which is effective to tune said tuner over a continuous band of frequencies;
   a selector shaft;
   means for establishing a plurality of detent positions for said selector shaft;
   a rotatable turret having a plurality of cam members mounted thereon;

means for selectively engaging a first predetermined single one of said cam members when said selector shaft is positioned in a first predetermined position;

means interconnecting said selector shaft, said tuning shaft and said turret, said interconnecting means including means for advancing said turret a single predetermined increment corresponding to the spacing between two adjacent cam members in response to the movement of said selector shaft a predetermined number greater than one of successive detent positions to bring a second one of said cam members into position for selective engagement by said engaging means; and cam follower means operatively coupling the cam member positioned for engagement by said engaging means to said tuner for adjusting said tuner in response to the rotation of one of said cam members to effect fine tuning of said tuning system.

2. A tuning system as recited in claim 1 wherein said cam follower means is mechanically coupled to said tuner for adjusting the relative position of said tuner and said tuning shaft.

3. A tuning system as recited in claim 2 wherein said cam members are rotatably mounted to said turret.

4. A tuning system as recited in claim 1 wherein said interconnecting means includes a Geneva mechanism for advancing said turret.

5. A tuning system as recited in claim 4 wherein said interconnecting means further includes a plurality of gears.

6. A tuning system as recited in claim 5 wherein one of said plurality of gears is a laterally moveable idler gear.

7. A tuning system as recited in claim 6 wherein said cam follower means includes a cam follower mechanically coupled to said laterally moveable idler gear for laterally moving said gear in response to the rotation of one of said cam members.

8. A tuning system as recited in claim 7 wherein each of said cam members is rotatably mounted in said turret and has an eccentric lobe engageable by said cam follower.

9. A tuning system as recited in claim 8 further including means for retarding the rotation of said cam members in said turret, said retarding means thereby tending to retain the setting of each of said cam members.

10. A tuning system as recited in claim 9 wherein said retarding means includes means for frictionally engaging each of said cam members.

11. A tuning system as recited in claim 8 wherein each of said cam members has a head engageable by said engaging means.

12. A tuning system as recited in claim 11 wherein said engaging means includes a cam driving member and said head has a slot defined therein for receiving said cam driving member.

13. A tuning system as recited in claim 11 wherein said cam driving member has an elongated shaft mounted for movement along the longitudinal axis thereof for engaging one of said cam members, and said engaging means includes resilient biasing means for urging said cam driving member out of engagement with said cam member.

14. A tuning system as recited in claim 13 wherein said engaging means includes an arm member for supporting said cam driving member.

15. A tuning system as recited in claim 14 further including a fine tuning shaft and gear means interconnecting said fine tuning shaft and said cam driving member.

16. A tuning system as recited in claim 15 wherein said gear means includes a plurality of gears rotatably mounted to said arm member.

17. A tuning system as recited in claim 16 wherein said fine tuning shaft is mounted concentrically with said selector shaft.

18. A tuning system as recited in claim 17 further including means connected to said selector shaft for limiting the range of rotation of said selector shaft to a predetermined number of turns.

19. A tuning system as recited in claim 9 further including means coupled to said cam follower means for disengaging said cam follower from said eccentric lobe when said turret is rotated between positions.

20. A system as recited in claim 1 wherein said tuner includes a mechanically tunable variable impedance element mechanically coupled to said cam follower means.

21. A system as recited in claim 20 wherein said tuner includes an oscillator and said variable impedance element is electrically coupled to said oscillator.

22. A system as recited in claim 21 wherein said variable impedance element is a piston capacitor.

23. A tuning system including in combination:

a UHF television tuner having a continuously variable tuning shaft, rotation of which is effective to tune said tuner to selectively receive signals from all television stations within the UHF television band;

a selector shaft;

means for establishing a plurality of equally spaced detent positions for said selector shaft, one for each of said television stations;

means interconnecting said selector shaft and said tuning shaft;

a rotatable turret having a plurality of cam members mounted thereon;

means coupling said turret to said selector shaft, said coupling means including means for rotating said turret a predetermined single increment in response to the rotation of said selector shaft by a plurality of successive detent positions;

a fine tuning shaft;

means for selectively coupling a first predetermined one of said cam members to said fine tuning shaft when said selector shaft is positioned in a detent position within a first predetermined group of adjacent detent positions, and for coupling a second predetermined one of said cam members to said fine tuning shaft when said selector shaft is positioned in a detent position within a second predetermined group of adjacent detent positions; and cam follower means operatively coupled to the one of said cam members selectively coupled to said fine tuning shaft and to said tuning shaft, said cam follower means being responsive to movement of the cam member coupled thereto to rotate said tuning shaft over a predetermined range of rotation.

24. A tuning system as recited in claim 23 wherein said predetermined range of rotation is less than the amount of rotation necessary to tune said tuner between adjacent channels.

25. A tuning system as recited in claim 24 wherein said coupling means includes a Geneva mechanism operatively coupling said turret and said selector shaft for advancing said turret a predetermined increment of rotation to position a different one of said cam members for engagement by said selective coupling means and said cam follower means.

26. A tuning system as recited in claim 25 wherein said interconnecting means further includes gear reduction means interconnecting said selector shaft and said tuning shaft for rotating said tuning shaft less than one revolution in response to a plurality of revolutions of said selector shaft.

27. A tuning system as recited in claim 26 wherein said cam follower means includes a cam follower disposed adjacent to said turret for successively engaging each one of cam members upon rotation of said turret, each of said cam members being engaged for a different predetermined position of said turret.

28. A tuning system as recited in claim 27 wherein said selective coupling means includes a cam driving member disposed adjacent to said turret for selectively engaging the cam member being engaged by said cam follower.

29. A tuning system as recited in claim 28 wherein said selective coupling means includes a gear train coupled to said tuning shaft and an elongated shaft coupling said gear train and said cam driving member, said shaft being positioned for engaging the cam member being engaged by said cam follower over the predetermined range of rotation of said selector shaft.

30. A tuning system as recited in claim 29 further including means coupling the fine tuning shaft and said elongated shaft for moving said cam driving member into engagement with the cam member positioned for engagement therewith in response to an axial movement of said fine tuning shaft.

31. A tuning system as recited in claim 30 wherein each of said cam members has a head engageable by said cam driving member.

32. A tuning system as recited in claim 27 further including an arm for rotatably supporting said cam driving member in alignment with the head of one of said cam members.

33. A tuning system as recited in claim 32 further including a drive train coupling said cam driving member to said fine tuning shaft for rotation therewith.

34. A tuning system as recited in claim 33 wherein said fine tuning shaft is axially moveable and further including means coupling said cam driving member and said fine tuning shaft for bringing said cam driving member into engagement with one of said cam members in response to axial movement of said fine tuning shaft.

35. A tuning system as recited in claim 27 further including means coupled to said cam follower means for disengaging said cam follower from the cam member in engagement therewith when said turret is rotated.

36. A tuning system as recited in claim 35 further including means coupled to said selector shaft for limiting the range of rotation of said selector shaft to a predetermined number of revolutions corresponding to the maximum range of rotation of said tuning shaft.

37. A tuning system as recited in claim 36 wherein said gear means includes a plurality of gears and further including a torsion spring attached to one of said gears for applying a preloading torque thereto.

38. A tuning system as recited in claim 35 further including means engaging each of said cam members for retarding the movement thereof.

39. A tuning system as recited in claim 38 wherein said retarding means includes means for frictionally engaging said cam members.

40. A tuning system as recited in claim 28 wherein said predetermined range of rotation of said turret corresponds to the range of rotation of three successive detent positions of said selector shaft.

41. A tuning system as recited in claim 28 wherein said predetermined range of rotation of said turret corresponds to the range of rotation of five successive detent positions of said selector shaft.

* * * * *